(12) United States Patent
Langhammer et al.

(10) Patent No.: US 7,836,117 B1
(45) Date of Patent: Nov. 16, 2010

(54) SPECIALIZED PROCESSING BLOCK FOR PROGRAMMABLE LOGIC DEVICE

(75) Inventors: Martin Langhammer, Salisbury (GB); Kwan Yee Martin Lee, Hayward, CA (US); Triet M. Nguyen, San Jose, CA (US); Keone Streicher, San Ramon, CA (US); Orang Azgomi, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 1058 days.

(21) Appl. No.: 11/458,361

(22) Filed: Jul. 18, 2006

Related U.S. Application Data

(60) Provisional application No. 60/790,404, filed on Apr. 7, 2006.

(51) Int. Cl.
   *G06F 7/38* (2006.01)
(52) U.S. Cl. ...................................... 708/603
(58) Field of Classification Search ........................ None
   See application file for complete search history.

(56) References Cited

U.S. PATENT DOCUMENTS

| | | |
|---|---|---|
| 3,473,160 A | 10/1969 | Wahlstrom |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,791,590 A | 12/1988 | Ku et al. |
| 4,799,004 A | 1/1989 | Mori |
| 4,823,295 A | 4/1989 | Mader |

(Continued)

FOREIGN PATENT DOCUMENTS

EP    0 158 430    10/1985

(Continued)

OTHER PUBLICATIONS

Altera Corporation, "DSP Blocks in Stratix II and Stratix II GX Devices" *Stratix II Device Handbook*, vol. 2, Chapter 6, v4.0 (Oct. 2005).

(Continued)

*Primary Examiner*—David H Malzahn
(74) *Attorney, Agent, or Firm*—Ropes & Gray LLP; Jeffrey H. Ingerman

(57) ABSTRACT

A specialized processing block for a programmable logic device incorporates a fundamental processing unit that performs a sum of two multiplications, adding the partial products of both multiplications without computing the individual multiplications. Such fundamental processing units consume less area than conventional separate multipliers and adders. The specialized processing block further has input and output stages, as well as a loopback function, to allow the block to be configured for various digital signal processing operations.

23 Claims, 10 Drawing Sheets

U.S. PATENT DOCUMENTS

| | | | |
|---|---|---|---|
| 4,839,847 A | 6/1989 | Laprade | |
| 4,871,930 A | 10/1989 | Wong et al. | |
| 4,912,345 A | 3/1990 | Steele et al. | |
| 4,918,637 A | 4/1990 | Morton | |
| 4,967,160 A | 10/1990 | Quievy et al. | |
| 4,982,354 A | 1/1991 | Takeuchi et al. | |
| 4,991,010 A | 2/1991 | Hailey et al. | |
| 4,994,997 A | 2/1991 | Martin et al. | |
| 5,073,863 A | 12/1991 | Zhang | |
| 5,081,604 A | 1/1992 | Tanaka | |
| 5,122,685 A | 6/1992 | Chan et al. | |
| 5,128,559 A | 7/1992 | Steele | |
| 5,175,702 A | 12/1992 | Beraud et al. | |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,339,263 A | 8/1994 | White | |
| 5,349,250 A | 9/1994 | New | |
| 5,357,152 A | 10/1994 | Jennings, III et al. | |
| 5,371,422 A | 12/1994 | Patel et al. | |
| 5,381,357 A | 1/1995 | Wedgwood et al. | |
| 5,404,324 A | 4/1995 | Colon-Benet | |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | |
| 5,497,498 A | 3/1996 | Taylor | |
| 5,500,812 A | 3/1996 | Saishi et al. | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,541,864 A | 7/1996 | Van Bavel et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,563,819 A | 10/1996 | Nelson | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,633,601 A | 5/1997 | Nagaraj | |
| 5,636,150 A | 6/1997 | Okamoto | |
| 5,636,368 A | 6/1997 | Harrison et al. | |
| 5,640,578 A | 6/1997 | Balmer et al. | |
| 5,644,522 A | 7/1997 | Moyse et al. | |
| 5,646,545 A | 7/1997 | Trimberger et al. | |
| 5,646,875 A | 7/1997 | Taborn et al. | |
| 5,648,732 A | 7/1997 | Duncan | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | |
| 5,696,708 A | 12/1997 | Leung | |
| 5,729,495 A | 3/1998 | Madurawe | |
| 5,740,404 A | 4/1998 | Baji | |
| 5,744,980 A | 4/1998 | McGowan et al. | |
| 5,744,991 A | 4/1998 | Jefferson et al. | |
| 5,754,459 A | 5/1998 | Telikepalli | |
| 5,761,483 A | 6/1998 | Trimberger | |
| 5,764,555 A | 6/1998 | McPherson et al. | |
| 5,768,613 A | 6/1998 | Asghar | |
| 5,777,912 A | 7/1998 | Leung et al. | |
| 5,784,636 A | 7/1998 | Rupp | |
| 5,790,446 A | 8/1998 | Yu et al. | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,808,926 A | 9/1998 | Gorshtein et al. | |
| 5,812,479 A | 9/1998 | Cliff et al. | |
| 5,812,562 A | 9/1998 | Baeg | |
| 5,815,422 A | 9/1998 | Dockser | |
| 5,821,776 A | 10/1998 | McGowan | |
| 5,825,202 A | 10/1998 | Tavana et al. | |
| 5,838,165 A | 11/1998 | Chatter | |
| 5,841,684 A | 11/1998 | Dockser | |
| 5,847,579 A | 12/1998 | Trimberger | |
| 5,847,981 A | 12/1998 | Kelley et al. | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | |
| 5,878,250 A | 3/1999 | LeBlanc | |
| 5,880,981 A | 3/1999 | Kojima et al. | |
| 5,892,962 A | 4/1999 | Cloutier | |
| 5,894,228 A | 4/1999 | Reddy et al. | |
| 5,898,602 A | 4/1999 | Rothman et al. | |
| 5,931,898 A | 8/1999 | Khoury | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,968,196 A | 10/1999 | Ramamurthy et al. | |
| 5,970,254 A | 10/1999 | Cooke et al. | |
| 5,978,260 A | 11/1999 | Trimberger et al. | |
| 5,982,195 A | 11/1999 | Cliff et al. | |
| 5,986,465 A | 11/1999 | Mendel | |
| 5,991,788 A | 11/1999 | Mintzer | |
| 5,991,898 A | 11/1999 | Rajski et al. | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,006,321 A | 12/1999 | Abbott | |
| 6,009,451 A | 12/1999 | Burns | |
| 6,018,755 A * | 1/2000 | Gonikberg et al. | 708/319 |
| 6,020,759 A | 2/2000 | Heile | |
| 6,021,423 A | 2/2000 | Nag et al. | |
| 6,029,187 A | 2/2000 | Verbauwhede | |
| 6,031,763 A | 2/2000 | Sansbury | |
| 6,041,340 A | 3/2000 | Mintzer | |
| 6,052,327 A | 4/2000 | Reddy et al. | |
| 6,052,755 A | 4/2000 | Terrill et al. | |
| 6,055,555 A | 4/2000 | Boswell et al. | |
| 6,064,614 A | 5/2000 | Khoury | |
| 6,065,131 A | 5/2000 | Andrews et al. | |
| 6,066,960 A | 5/2000 | Pedersen | |
| 6,069,487 A | 5/2000 | Lane et al. | |
| 6,072,994 A | 6/2000 | Phillips et al. | |
| 6,073,154 A | 6/2000 | Dick | |
| 6,075,381 A | 6/2000 | LaBerge | |
| 6,084,429 A | 7/2000 | Trimberger | |
| 6,085,317 A | 7/2000 | Smith | |

| | | | |
|---|---|---|---|
| 6,091,261 A | 7/2000 | DeLange | |
| 6,091,765 A | 7/2000 | Pietzold, III et al. | |
| 6,094,726 A | 7/2000 | Gonion et al. | |
| 6,097,988 A | 8/2000 | Tobias | |
| 6,098,163 A | 8/2000 | Guttag et al. | |
| 6,107,820 A | 8/2000 | Jefferson et al. | |
| 6,107,821 A | 8/2000 | Kelem et al. | |
| 6,107,824 A | 8/2000 | Reddy et al. | |
| 6,130,554 A | 10/2000 | Kolze et al. | |
| 6,140,839 A | 10/2000 | Kaviani et al. | |
| 6,144,980 A | 11/2000 | Oberman | |
| 6,154,049 A | 11/2000 | New | |
| 6,157,210 A | 12/2000 | Zaveri et al. | |
| 6,163,788 A | 12/2000 | Chen et al. | |
| 6,167,415 A | 12/2000 | Fischer et al. | |
| 6,175,849 B1 | 1/2001 | Smith | |
| 6,215,326 B1 | 4/2001 | Jefferson et al. | |
| 6,226,735 B1 | 5/2001 | Mirsky | |
| 6,242,947 B1 | 6/2001 | Trimberger | |
| 6,243,729 B1 | 6/2001 | Staszewski | |
| 6,246,258 B1 | 6/2001 | Lesea | |
| 6,279,021 B1 | 8/2001 | Takano et al. | |
| 6,286,024 B1 | 9/2001 | Yano et al. | |
| 6,314,442 B1 | 11/2001 | Suzuki | |
| 6,314,551 B1 | 11/2001 | Borland | |
| 6,321,246 B1 | 11/2001 | Page et al. | |
| 6,323,680 B1 | 11/2001 | Pedersen et al. | |
| 6,327,605 B2 | 12/2001 | Arakawa et al. | |
| 6,351,142 B1 | 2/2002 | Abbott | |
| 6,353,843 B1 | 3/2002 | Chehrazi et al. | |
| 6,359,468 B1 | 3/2002 | Park et al. | |
| 6,360,240 B1 | 3/2002 | Takano et al. | |
| 6,362,650 B1 | 3/2002 | New et al. | |
| 6,366,944 B1 | 4/2002 | Hossain et al. | |
| 6,367,003 B1 | 4/2002 | Davis | |
| 6,369,610 B1 | 4/2002 | Cheung et al. | |
| 6,377,970 B1* | 4/2002 | Abdallah et al. | 708/603 |
| 6,407,576 B1 | 6/2002 | Ngai et al. | |
| 6,407,694 B1 | 6/2002 | Cox et al. | |
| 6,434,587 B1 | 8/2002 | Liao et al. | |
| 6,438,569 B1* | 8/2002 | Abbott | 708/603 |
| 6,438,570 B1 | 8/2002 | Miller | |
| 6,446,107 B1 | 9/2002 | Knowles | |
| 6,453,382 B1 | 9/2002 | Heile | |
| 6,467,017 B1 | 10/2002 | Ngai et al. | |
| 6,480,980 B2 | 11/2002 | Koe | |
| 6,483,343 B1 | 11/2002 | Faith et al. | |
| 6,487,575 B1 | 11/2002 | Oberman | |
| 6,523,055 B1* | 2/2003 | Yu et al. | 708/603 |
| 6,531,888 B2 | 3/2003 | Abbott | |
| 6,538,470 B1 | 3/2003 | Langhammer et al. | |
| 6,542,000 B1 | 4/2003 | Black et al. | |
| 6,556,044 B2 | 4/2003 | Langhammer et al. | |
| 6,557,092 B1 | 4/2003 | Callen | |
| 6,571,268 B1 | 5/2003 | Giacalone et al. | |
| 6,573,749 B2 | 6/2003 | New et al. | |
| 6,574,762 B1 | 6/2003 | Karimi et al. | |
| 6,591,283 B1 | 7/2003 | Conway et al. | |
| 6,591,357 B2 | 7/2003 | Mirsky | |
| 6,600,495 B1 | 7/2003 | Boland et al. | |
| 6,600,788 B1 | 7/2003 | Dick et al. | |
| 6,628,140 B2 | 9/2003 | Langhammer et al. | |
| 6,687,722 B1* | 2/2004 | Larsson et al. | 708/319 |
| 6,692,534 B1* | 2/2004 | Wang et al. | 708/100 |
| 6,700,581 B2 | 3/2004 | Baldwin et al. | |
| 6,725,441 B1 | 4/2004 | Keller et al. | |
| 6,728,901 B1 | 4/2004 | Rajski et al. | |
| 6,731,133 B1 | 5/2004 | Feng et al. | |
| 6,732,134 B1 | 5/2004 | Rosenberg et al. | |
| 6,744,278 B1 | 6/2004 | Liu et al. | |
| 6,745,254 B2 | 6/2004 | Boggs et al. | |
| 6,763,367 B2 | 7/2004 | Kwon et al. | |
| 6,771,094 B1 | 8/2004 | Langhammer et al. | |
| 6,774,669 B1 | 8/2004 | Liu et al. | |
| 6,781,408 B1 | 8/2004 | Langhammer | |
| 6,781,410 B2 | 8/2004 | Pani et al. | |
| 6,788,104 B2 | 9/2004 | Singh et al. | |
| 6,801,924 B1 | 10/2004 | Green et al. | |
| 6,836,839 B2 | 12/2004 | Master et al. | |
| 6,874,079 B2 | 3/2005 | Hogenauer | |
| 6,904,471 B2 | 6/2005 | Boggs et al. | |
| 6,924,663 B2 | 8/2005 | Masui et al. | |
| 6,963,890 B2 | 11/2005 | Dutta et al. | |
| 6,971,083 B1 | 11/2005 | Farrugia et al. | |
| 6,978,287 B1 | 12/2005 | Langhammer | |
| 7,020,673 B2 | 3/2006 | Ozawa | |
| 7,093,204 B2 | 8/2006 | Oktem et al. | |
| 7,107,305 B2 | 9/2006 | Deng et al. | |
| 7,113,969 B1 | 9/2006 | Green et al. | |
| 7,181,484 B2 | 2/2007 | Stribaek et al. | |
| 7,313,585 B2 | 12/2007 | Winterrowd | |
| 7,395,298 B2* | 7/2008 | Debes et al. | 708/603 |
| 7,409,417 B2 | 8/2008 | Lou | |
| 7,415,542 B2 | 8/2008 | Hennedy et al. | |
| 7,421,465 B1 | 9/2008 | Rarick et al. | |
| 7,428,566 B2 | 9/2008 | Siu et al. | |
| 7,430,578 B2* | 9/2008 | Debes et al. | 708/603 |
| 7,430,656 B2 | 9/2008 | Sperber et al. | |
| 7,472,155 B2 | 12/2008 | Simkins et al. | |
| 7,536,430 B2 | 5/2009 | Guevokian et al. | |
| 7,590,676 B1 | 9/2009 | Langhammer | |
| 7,646,430 B2 | 1/2010 | Brown Elliott et al. | |
| 7,668,896 B2 | 2/2010 | Lutz et al. | |
| 2001/0023425 A1 | 9/2001 | Oberman et al. | |
| 2001/0029515 A1 | 10/2001 | Mirsky | |
| 2002/0002573 A1 | 1/2002 | Landers et al. | |
| 2002/0089348 A1 | 7/2002 | Langhammer | |
| 2002/0116434 A1* | 8/2002 | Nancekievill | 708/625 |
| 2003/0088757 A1 | 5/2003 | Lindner et al. | |
| 2004/0064770 A1 | 4/2004 | Xin | |
| 2004/0083412 A1 | 4/2004 | Corbin et al. | |
| 2004/0103133 A1 | 5/2004 | Gurney | |
| 2004/0148321 A1 | 7/2004 | Guevorkian et al. | |
| 2004/0172439 A1 | 9/2004 | Lin | |
| 2004/0178818 A1 | 9/2004 | Crotty et al. | |
| 2004/0193981 A1 | 9/2004 | Clark et al. | |
| 2004/0267863 A1 | 12/2004 | Bhushan et al. | |
| 2005/0038842 A1 | 2/2005 | Stoye | |
| 2005/0144212 A1 | 6/2005 | Simkins et al. | |
| 2005/0144215 A1 | 6/2005 | Simkins et al. | |
| 2005/0144216 A1 | 6/2005 | Simkins et al. | |
| 2005/0166038 A1 | 7/2005 | Wang et al. | |
| 2005/0187997 A1 | 8/2005 | Zheng et al. | |
| 2005/0187999 A1 | 8/2005 | Zheng et al. | |
| 2006/0020655 A1 | 1/2006 | Lin | |
| 2007/0185951 A1 | 8/2007 | Lee et al. | |
| 2007/0185952 A1 | 8/2007 | Langhammer et al. | |
| 2007/0241773 A1 | 10/2007 | Hutchings et al. | |
| 2008/0133627 A1 | 6/2008 | Langhammer et al. | |
| 2009/0187615 A1 | 7/2009 | Abe et al. | |

FOREIGN PATENT DOCUMENTS

| | | |
|---|---|---|
| EP | 0 380 456 | 8/1990 |
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |

| | | |
|---|---|---|
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO-2005/101190 | 10/2005 |

OTHER PUBLICATIONS

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.
Xilinx Inc., "XtremeDSP Design Considerations User Guide," v 1.2, Feb. 4, 2005.
Amos, D., "PLD architectures match DSP algorithms," *Electronic Product Design*, vol. 17, No. 7, Jul. 1996, pp. 30, 32.
Analog Devices, Inc., The Applications Engineering Staff of Analog Devices, DSP Division, *Digital Signal Processing Applications Using the ADSP-2100 Family* (edited by Amy Mar), 1990, pp. 141-192).
Andrejas, J., et al., "Reusable DSP functions in FPGAs" *Field-Programmable Logic and Applications. Roadmap to Reconfigurable Computing. 10th International Conference, FPL 2000. Proceedings* (*Lecture Notes in Computer Science* vol. 1896), Aug. 27-30, 2000, pp. 456-461.
Aoki, T., "Signed-weight arithmetic and its application to a field-programmable digital filter architecture," *IEICE Transactions on Electronics*, 1999, vol. E82C, No. 9, Sep. 1999, pp. 1687-1698.
Ashour, M.A., et al., "An FPGA implementation guide for some different types of serial-parallel multiplier-structures," *Microelectronics Journal*, vol. 31, No. 3, 2000, pp. 161-168.
Berg. B.L., et al. "Designing Power and Area Efficient Multistage FIR Decimators with Economical Low Order Filters," *ChipCenter Technical Note*, Dec. 2001.
Bursky, D., "Programmable Logic Challenges Traditional ASIC SoC Designs", *Electronic Design*, Apr. 15, 2002.
Chhabra, A. et al., Texas Instruments Inc., "A Block Floating Point Implementation on the TMS320C54x DSP", Application Report SPRA610, Dec. 1999, pp. 1-10.
Colet, p., "When DSPs and FPGAs meet: Optimizing image processing architectures," *Advanced Imaging*, vol. 12, No. 9, Sep. 1997, pp. 14, 16, 18.
Crookes, D., et al., "Design and implementation of a high level programming environment for FPGA-based image processing," *IEE Proceedings-Vision, Image and Signal Processing*, vol. 147, No. 4, Aug. 2000, pp. 377-384.
Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.
Dick, C., et al., "Configurable logic for digital communications: some signal processing perspectives," *IEEE Communications Magazine*, vol. 37, No. 8, Aug. 1999, pp. 107-111.
Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.
Gaffar, A.A., et al., "Floating-Point Bitwidth Analysis via Automatic Differentiation," *IEEE Conference on Field Programmable Technology*, Hong Kong, Dec. 2002.
Guccione, S.A.,"Run-time Reconfiguration at Xilinx," *Parallel and distributed processing: 15 IPDPS 2000 workshops*, Rolim, J., ed., May 1-5, 2000, p. 873.
Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.PDF.
Heysters, P.M., et al., "Mapping of DSP algorithms on field programmable function arrays," *Field-Programmable Logic and Applications. Roadmap to Reconfigurable Computing. 10th International Conference, FPL 2000. Proceedings* (*Lecture Notes in Computer Science* vol. 1896), Aug. 27-30, 2000, pp. 400-411.
Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.
Lattice Semiconductor Corp, *ORCA® FPGA Express™ Interface Manual: ispLEVER® Version 3.0*, 2002.
Lucent Technologies, Microelectronics Group,"Implementing and Optimizing Multipliers in ORCA™ FPGAs,", Application Note. AP97-008FGPA, Feb. 1997.
"Implementing Multipliers in FLEX 10K EABs", *Altera*, Mar. 1996.
"Implementing Logic with the Embedded Array in FLEX 10K Devices", *Altera*, May 2001, ver. 2.1.
Jinghua Li, "Design a pocket multi-bit multiplier in FPGA," *1996 2nd International Conference on ASIC Proceedings* (*IEEE Cat. No. 96TH8140*), Oct. 21-24, 1996, pp. 275-279.
Jones, G., "Field-programmable digital signal conditioning," *Electronic Product Design*, vol. 21, No. 6, Jun. 2000, pp. C36-C38.
Kiefer, R., et al., "Performance comparison of software/FPGA hardware partitions for a DSP application," *14th Australian Microelectronics Conference, Microelectronics: Technology Today for the Future. MICRO '97 Proceedings*, Sep. 28-Oct. 1, 1997, pp. 88-93.
Kramberger, I., "DSP acceleration using a reconfigurable FPGA," *ISIE '99. Proceedings of the IEEE International Symposium on Industrial Electronics* (Cat. No. 99TH8465), vol. 3, Jul. 12-16, 1999, pp. 1522-1525.
Langhammer, M., "How to implement DSP in programmable logic," *Elettronica Oggi*, No. 266, Dec. 1998, pp. 113-115.
Langhammer, M., "Implementing a DSP in Programmable Logic," *Online EE Times*, May 1998, http://www.eetimes.com/editorial/1998/coverstory9805.html.
Lazaravich, B.V., "Function block oriented field programmable logic arrays," *Motorola, Inc. Technical Developments*, vol. 18, Mar. 1993, pp. 10-11.
Lund, D., et al., "A new development system for reconfigurable digital signal processing," *First International Conference on 3G Mobile Communication Technologies* (Conf. Publ. No. 471), Mar. 27-29, 2000, pp. 306-310.
Miller, N.L., et al., "Reconfigurable integrated circuit for high performance computer arithmetic," *Proceedings of the 1998 IEE Colloquium on Evolvable Hardware Systems* (*Digest*), No. 233, 1998, pp. 2/1-2/4.
Mintzer, L, "Xilinx FPGA as an FFT processor," *Electronic Engineering*, vol. 69, No. 845, May 1997, pp. 81, 82, 84.
Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.
Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9) vol. 3, Oct. 28-Nov. 1, 1991, pp. 2014-2018.
Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering* vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL '99, Proceedings (Lecture Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Valls, J., et al., "A Study About FPGA-Based Digital Filters," *Signal Processing Systems, 1998*, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

Walters, A.L., "A Scaleable FIR Filter Implementation Using 32-bit Floating-Point Complex Arithmetic on a FPGA Based Custom Computing Platform," Allison L. Walters, Thesis Submitted to the Faculty of Virginia Polytechnic Institute and State University, Jan. 30, 1998.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http://www.iro.umontreal.ca/~aboulham/F6221/Xilinx%20A%201D%20systolic%20FIR.htm.

Xilinx, Inc., "The Future of FPGA's," White Paper, available Nov. 14, 2005 for download from http://www.xilinx.com/prs_rls,5yrwhite.htm.

Langhammer et al. U.S. Appl. No. 11/426,403, filed Jun. 26, 2006.
Lee et al. U.S. Appl. No. 11/447,329, filed Jun. 5, 2006.
Langhammer et al. U.S. Appl. No. 11/447,370, filed Jun. 5, 2006.
Langhammer et al. U.S. Appl. No. 11/447,472, filed Jun. 5, 2006.
Lee et al. U.S. Appl. No. 11/447,474, filed Jun. 5, 2006.

Weisstein, E.W., "Karatsuba Multiplication," *MathWorld—A Wolfram Web Resource* (Dec. 9, 2007), accessed Dec. 11, 2007 at http://mathworld.wolfram.com/KaratsubaMultiplication.html.

Altera Corporation, "Digital Signal Processing (DSP)," *Stratix Device Handbook*, vol. 2, Chapter 6 and Chapter 7, v1.1 (Sep. 2004).

Altera Corporation, "Stratix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

\* cited by examiner

SPECIALIZED PROCESSING BLOCK FOR PROGRAMMABLE LOGIC DEVICE

CROSS REFERENCE TO RELATED APPLICATION

This claims the benefit of commonly-assigned U.S. Provisional Patent Application No. 60/790,404, filed Apr. 7, 2006, which is hereby incorporated by reference herein in its entirety.

BACKGROUND OF THE INVENTION

This invention relates to programmable logic devices (PLDs), and, more particularly, to specialized processing blocks which may be included in such devices.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, a PLD sold by Altera Corporation, of San Jose, Calif., under the name STRATIX® II includes DSP blocks, each of which includes four 18-by-18 multipliers. Each of those DSP blocks also includes adders and registers, as well as programmable connectors (e.g., multiplexers) that allow the various components to be configured in different ways. In each such block, the multipliers can be configured not only as four individual 18-by-18 multipliers, but also as four smaller multipliers, or as one larger (36-by-36) multiplier. In addition, one 18-by-18 complex multiplication (which decomposes into two 18-by-18 multiplication operations for each of the real and imaginary parts) can be performed. In order to support four 18-by-18 multiplication operations, the block has 4×(18+18)=144 inputs. Similarly, the output of an 18-by-18 multiplication is 36 bits wide, so to support the output of four such multiplication operations, the block also has 36×4=144 outputs.

However, those inputs and outputs may not be used in every mode in which the DSP block can operate. For example, if the DSP block is configured as a finite impulse response (FIR) filter, with 18-bit data and coefficients, each block may be used to perform the summation of four 18-by-18 multiplications to form a 4-tap sub-block of a longer FIR filter. In this case, the number of inputs is 4×(18+18)=144 lines, but the output is only 38 bits wide even though the DSP block is able to support 144 output lines. Similarly, in a 36-by-36 bit multiplication, all four internal multipliers are used but only (36+36)=72 input lines and 72 output lines are used (even though there are 144 input lines and 144 output lines). Hence, in that configuration the input lines are not used fully even though the core of the DSP block is fully used.

Input/output (I/O) drivers and lines can consume significant device area. Indeed, in a DSP block of the aforementioned STRATIX® II PLD, I/O resources consume approximately 50% of the DSP block area. And yet, as discussed above, they are not always used. At the same time, they cannot be eliminated because all of the potential configurations of the block have to be supported.

It would be desirable to be able to reduce the area of a PLD consumed by a specialized processing block such as a DSP block without losing functionality of the block.

SUMMARY OF THE INVENTION

The present invention relates to specialized processing blocks for PLDs wherein the specialized processing blocks have reduced area without losing functionality. According to one aspect of the invention, the specialized processing block preferably includes a plurality of fundamental processing units instead of discrete multipliers. Each fundamental processing unit preferably includes the equivalent of at least two multipliers and logic to sum the partial products of all of the at least two multipliers. As a result, the sums of the all of the multiplications are computed in a single step, rather than summing the partial products of each multiplier to form individual products and then summing those products. Such a fundamental processing unit can be constructed with an area smaller than that of the individual multipliers and adders. If a single multiplication is required to be performed, one of the multipliers in the fundamental processing unit is used, while the inputs to the other(s) are zeroed out. Nevertheless, because the provision of the fundamental processing unit reduces the area of the specialized processing block, efficiency is improved.

In a preferred embodiment, the fundamental processing unit includes the equivalent of two 18-by-18 multipliers and one adder so that it can output the sum of the two multiplication operations. While each of the 18-by-18 multipliers can be configured for a smaller multiplication operation (e.g., 9-by-9 or 12-by-12), the integrated nature of the fundamental processing unit means that the individual multiplier outputs are not accessible. Only the sum is available for use by the remainder of the specialized processing block. Therefore, to obtain the result of a single non-complex multiplication that is 18 bits-by-18 bits or smaller, an entire fundamental processing unit must be used. The second multiplier, which cannot be disengaged, simply has its inputs zeroed.

Preferably, each block includes four such fundamental processing units, preferably arranged in half-blocks having two fundamental processing units each, capable of computing a sum of four multiplications. Additional facility preferably is provided to connect the two half-blocks to allow more complex computations when necessary.

The specialized processing block according to the invention preferably also has an input multiplexing stage that increases the effective number of inputs for certain more complex operations without increasing the number of I/O lines. Similarly, an output cascade stage allows the outputs of several blocks to be chained for certain more complex operations. Therefore the specialized processing block preferably can be configured for various forms of filtering and other digital signal processing operations. In addition, the specialized processing block preferably also has the capability to feed back at least one of its outputs as an input, which is useful for accumulation and also in adaptive filtering operations.

Therefore, in accordance with the present invention, there is provided a specialized processing block for a programmable logic device. The specialized processing block preferably includes a plurality of fundamental processing units, Each of the fundamental processing units includes a plurality of multipliers, circuitry for adding, in one operation, partial products produced by all of the plurality of multipliers, and circuitry interconnecting the fundamental processing units whereby the circuitry for adding adds, in that one operation, the partial products produced by all of the plurality of multipliers in all of the fundamental processing units.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-12.

Figure 1:
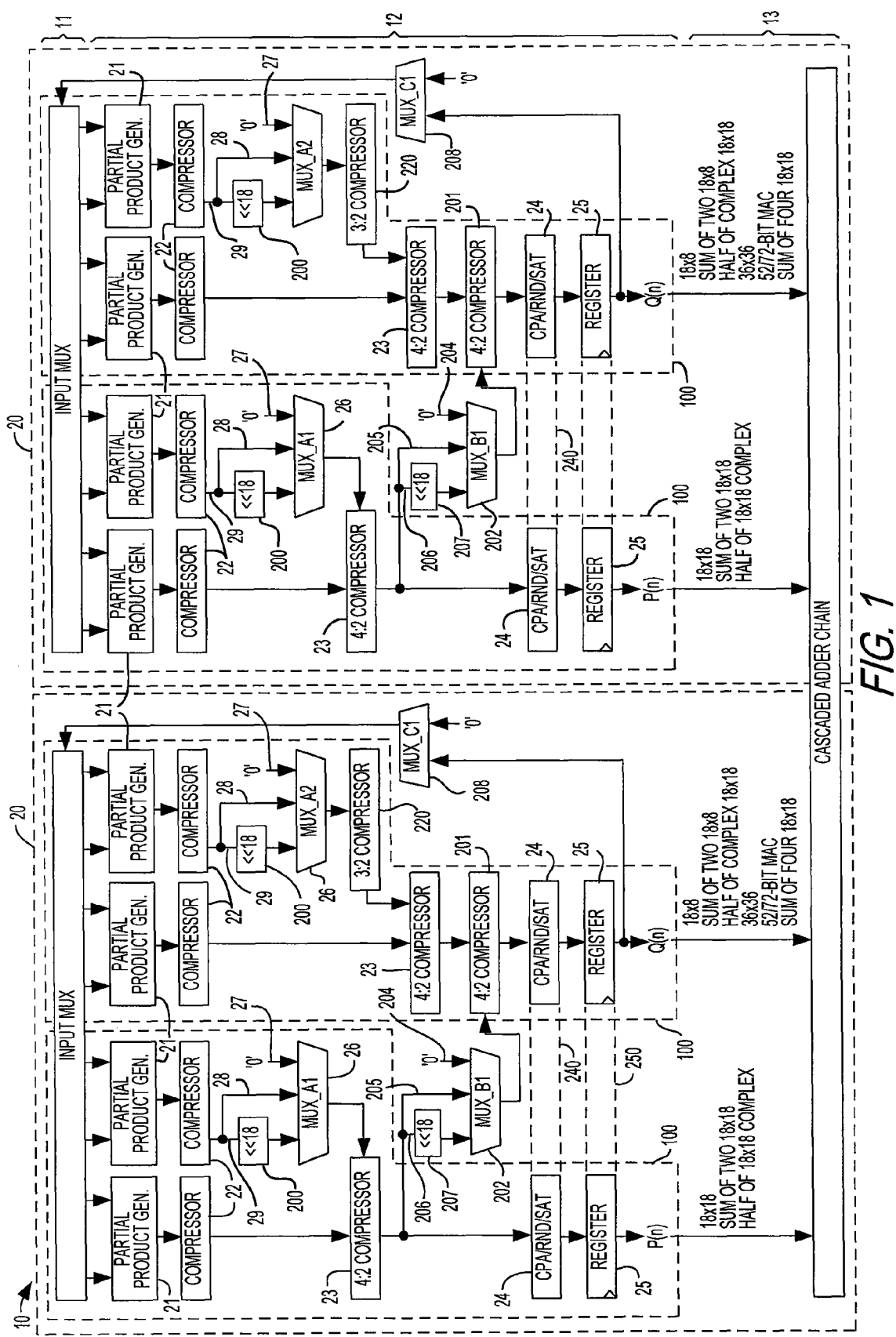
FIG. 1 is a functional diagram of one preferred embodiment of a specialized processing block in accordance with the present invention.

FIG. 1 shows a functional diagram of one preferred embodiment 10 of a specialized processing block according to the invention. As seen in FIG. 1, specialized processing block 10 includes input multiplexing stage 11, multiplication stage 12, and output cascade stage 13.

Input multiplexing stage 11 can format and rearrange the inputs to block 10 as required for particular operations. As described in more detail below, input multiplexing stage 10 can be used to allow the performance, in certain conditions, of operations that require more inputs than there are to block 10, if some of those inputs are duplicates of others.

As one example of the type of formatting performed by input multiplexing stage 11, consider an 18-by-18 complex multiplication in which:

Real Result=$Re[(a+jb)\times(c+jd)]=(ac-bd)$

Imag Result=$Im[(a+jb)\times(c+jd)]=(ad+bc)$

This complex operation requires four 18-by-18 multiplications and hence eight 18-bit inputs, for a total of 144 inputs. Although each half-block 20 can have 144 inputs, in a preferred embodiment, specialized processing block 10 as a whole accepts only 144 inputs. If all of those inputs were routed to only one of the half-blocks 20, there would be no inputs available for the other half-block 20. However, because the complex multiplication referred to above has only four unique 18-bit shared inputs, input multiplexing stage 11 can take the 72 inputs a, b, c and d and perform the necessary duplication so those four inputs are properly routed to the correct multiplier inputs for each of the real and imaginary calculations. This leaves another 72 inputs available for the other half-block 20.

Multiplication stage 12 preferably includes a plurality of fundamental processing units as described above. In a preferred embodiment, each specialized processing block 10 (see FIGS. 1 and 2) includes four fundamental processing units 100, meaning that it can perform up to eight multiplications in groups of two multiplications that are summed together. In that embodiment, the fundamental processing units 100 in specialized processing block 10 preferably are grouped into identical half-blocks 20, so that each half-block 20 in its own right can be considered a specialized processing block within the invention.

Each fundamental processing unit 100 preferably includes the functionality for a sum of two 18-by-18 multiplications. It is possible to negate one of the inputs in input multiplexing stage 11 in order to provide a difference of multiplications.

Each fundamental processing unit 100 preferably supports a sum of two 18-by-18 multiplications and preferably includes two partial product generators 21, two ten-vector-to-two-vector compressors 22, a 4:2 compressor 23, a carry-propagate adder 24 and an output register 25. Adder 24 preferably also includes rounding capability (e.g., round-to-nearest-integer) and saturation capability (e.g., asymmetric saturation—i.e., from $-(2^n)$ to $+2^n-1$).

Each partial product generator 21 preferably creates nine 20-bit Booth-encoded vectors (Booth-encoding is a known technique that can reduce the number of partial products), as well as a 17-bit unsigned carry vector (negative partial products are in ones-complement format, with the associated carry-in bit in the carry vector). An additional 19-bit signed partial product may be generated in the case of unsigned multipliers (which preferably will always be zero for signed multipliers). Although preferably up to 11 vectors may be generated, the carry bits preferably can be combined with the partial product vectors, requiring only 10 vectors to be compressed.

In each fundamental processing unit 100, preferably the output of one of the two 10:2 compressors 22 passes through 3:1 multiplexer 26. In a case where fundamental processing unit 100 is being used for only one multiplication of a size up to 18-by-18, zero input 27 of multiplexer 26 is selected, zeroing out one of the two 18-by-18 multiplications. In a case where fundamental processing unit 100 is being used for two 18-by-18 multiplications (including a case where half-block 20 is being used for a sum-of-four 18-by-18 multiplications such as one of the complex multiplications described above), input 28 of multiplexer 26 is selected to pass the compressor vectors unchanged. In a case where both fundamental processing units 100 are being used together to perform a 36-by-36 multiplication, input 29 of multiplexer 26 is selected, passing the output of that one of compressors 22 through an 18-bit left-shifter 200.

Figure 2:
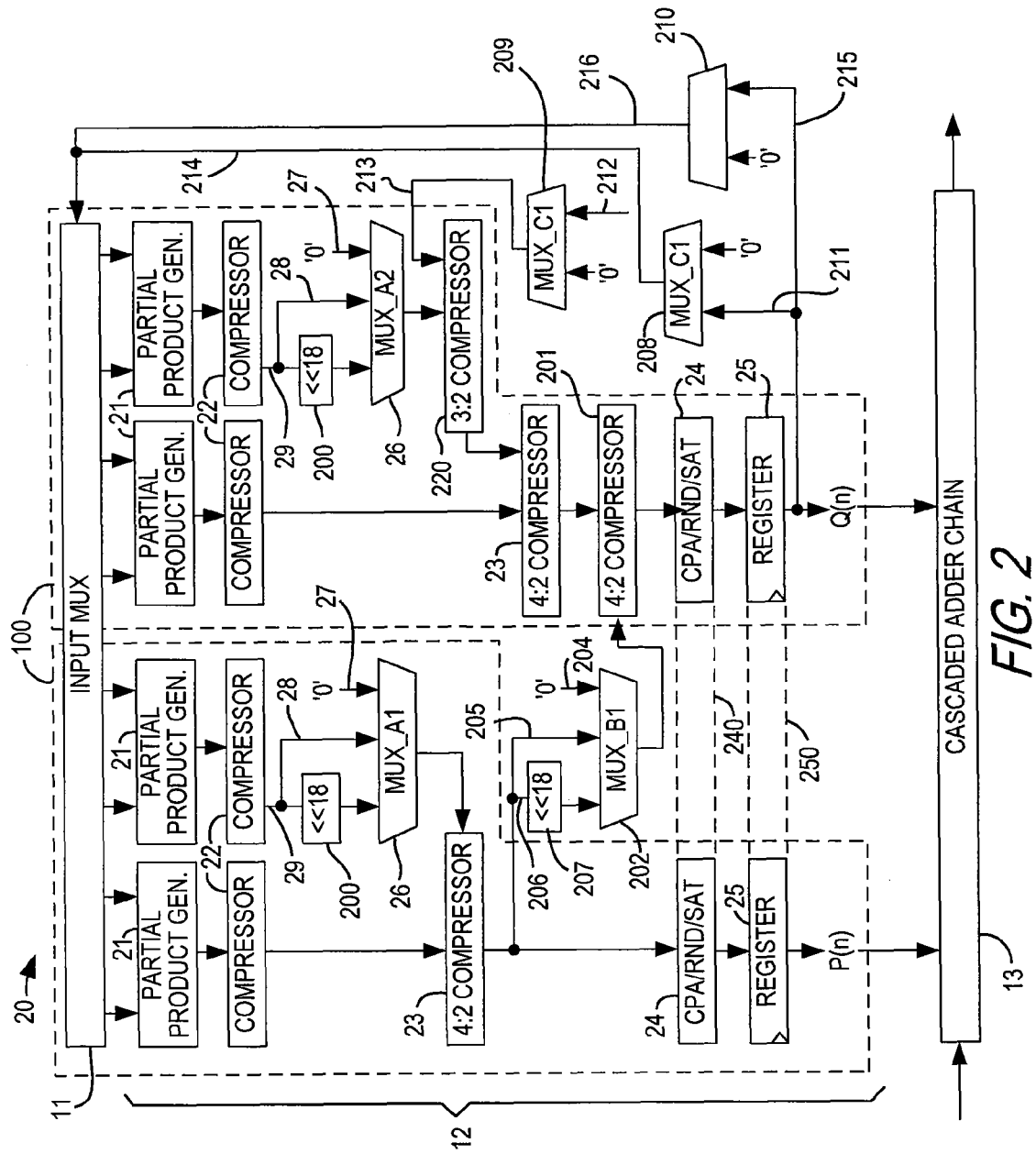
FIG. 2 is a functional diagram of one half of the specialized processing block of FIG. 1.

As shown in FIGS. 1 and 2, each fundamental processing unit 100 outputs a respective separate output vector P(n) or Q(n). However, an additional 4:2 compressor 201, along with multiplexer 202 and shifter 203, are provided to allow the two fundamental processing units 100 to be used together. In the embodiment shown, 4:2 compressor 201 is included in the right-hand one of fundamental processing units 100, accepting as inputs the output of 4:2 compressor 23 from that fundamental processing unit 100 as well as the output of 4:2 compressor 23 from the left-hand one of fundamental processing units 100, as modified by multiplexer 202.

Thus, zero input 204 of multiplexer 202 zeroes the left-hand input to compressor 201, and is selected when the two fundamental processing units 100 are to be used separately. In a case where the two fundamental processing units 100 are being used together, such as a case where half-block 20 is being used for a sum-of-four 18-by-18 multiplications such as one of the complex multiplications described above, input 205 of multiplexer 202 is selected to pass the compressor vectors unchanged. In a case where both fundamental processing units 100 are being used together to perform a 36-by-36 multiplication, input 206 of multiplexer 22 is selected, passing the output of that one of left-hand compressor 23 through an 18-bit left-shifter 207.

When both fundamental processing units 100 are being used together, the two carry-propagate adders 24 preferably are used as a single adder, as indicated by the dashed lines 240. Similarly, the two output registers 25 preferably are used as a single output register as indicated by dashed lines 250.

Preferably, the Q(n) output (which could include the P(n) output in cases where both fundamental processing units 100 are being used together) can be fed back either to 3:2 compressor 220, which preferably is interposed between 3:1 multiplexer 26 and 4:2 compressor 23 of right-hand fundamental processing unit 100, where it is combined with the output of multiplexer 26 to enable an accumulation function, or to input multiplexing stage 11 as a loopback to enable various adaptive filtering functions. This feedback or loopback preferably is accomplished using optional multiplexers 208-210 and optional connections 211-216.

For example, using optional multiplexer 208 and connections 211-213, one can implement the aforementioned accumulation feedback. In such an embodiment, multiplexer 208 can select either output Q(n) or zero as an input to be fed back.

If optional connection 214 is added between connection 212 and input multiplexing stage 11, and optional multiplexer 209 is added between connections 212 and 213, then the output of multiplexer 208 can be used either as accumulation feedback or as the aforementioned loopback. In loopback mode, multiplexer 209 would select a zero input to prevent the loopback data from reaching compressor 220. In feedback mode, multiplexer 209 would select the feedback data. It is not necessary in feedback mode to provide an additional multiplexer (or other selector device) to prevent the feedback data from reaching input multiplexing stage 11, because internal multiplexers (not shown) in stage 11 can be used for that purpose.

Alternatively, multiplexer 209 and connection 214 can be omitted, and a completely independent loopback path can be established using optional multiplexer 210 and optional connections 215, 216. The two separate paths would not normally be used simultaneously because output Q(n) would not normally be used for both feedback and loopback. However, the two embodiments are essentially interchangeable because each requires two multiplexers.

As indicated in FIG. 1, when outputs P(n), Q(n) are used separately, each can represent, for example, one 18-by-18 multiplication or one sum of two 18-by-18 multiplications. Because an 18-by-18 complex multiplication, as described above, is specialized sum of four 18-by-18 multiplications, the sum of two 18-by-18 multiplications represented by an output P(n) or Q(n) can represent half of an 18-by-18 complex multiplication.

Similarly, as shown, when outputs P(n), Q(n) are used together, the output is represented by Q(n), which can represent, for example, any of one 36-by-36 multiplication, one 52-bit to 72-bit multiply-accumulate function, or one sum of four 18-by-18 multiplications.

As discussed above, each half-block 20 preferably has 72 inputs. Four 18-by-18 multiplications requires 36×4=144 inputs. As also discussed above, in the case of an 18-by-18 complex multiplication, although there are four 18-by-18 multiplications involved, there are really only four 18-bit inputs (72 inputs), which are rearranged as necessary by input multiplexing stage 11. In the case of a sum of four independent 18-by-18 multiplications, input multiplexing stage 11 preferably is used as a shift register as shown in FIG. 3.

Figure 3:
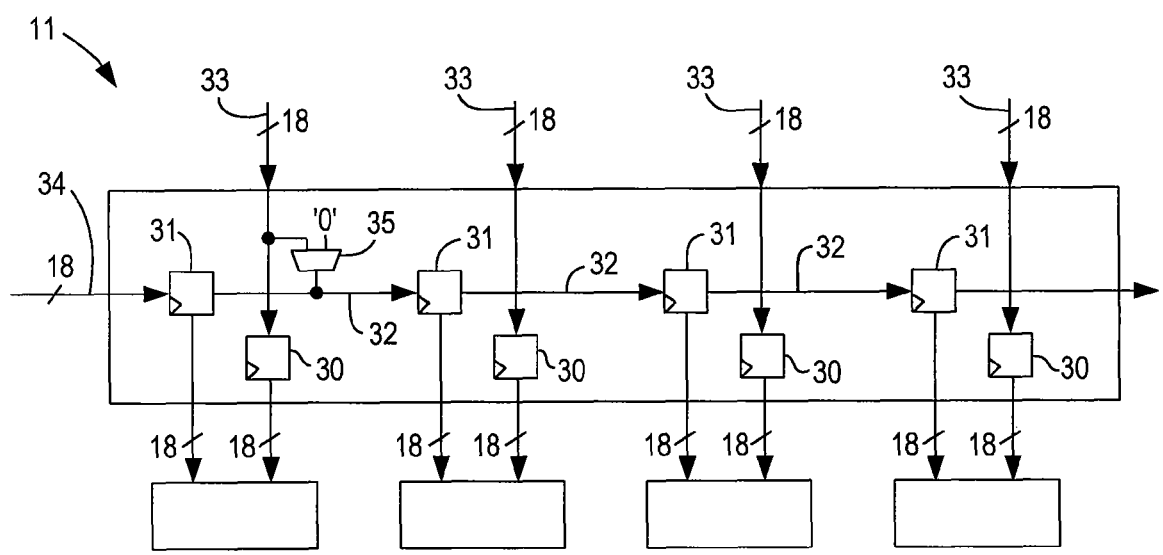
FIG. 3 is a block diagram of a preferred embodiment of the input multiplexing stage of the specialized processing block of FIGS. 1 and 2.

As shown in FIG. 3, input multiplexing stage 11 preferably includes, in addition to multiplexers and other circuitry (not shown), a first set of 18-bit registers 30, each of which is associated with one of partial product generators 21, and a second set of 18-bit registers 31, each one of which also is associated with one of partial product generators 21 and all of which are chained together (as at 32). In this way, for each 18-by-18 multiplication, one independent multiplicand may be input via the block inputs 33 and registers 30, while the second input for each 18-by-18 multiplication is shifted in via registers 31. Thus in the case of a sum of four 18-by-18 multiplications, one multiplicand is the same in each of the four multiplications. That one common multiplicand may be input via additional input 34, or the first one of inputs 33 in the first block 10 (assuming cascaded blocks 10 as discussed below), can be connected via multiplexer 35 to chained registers 31.

Figure 4:
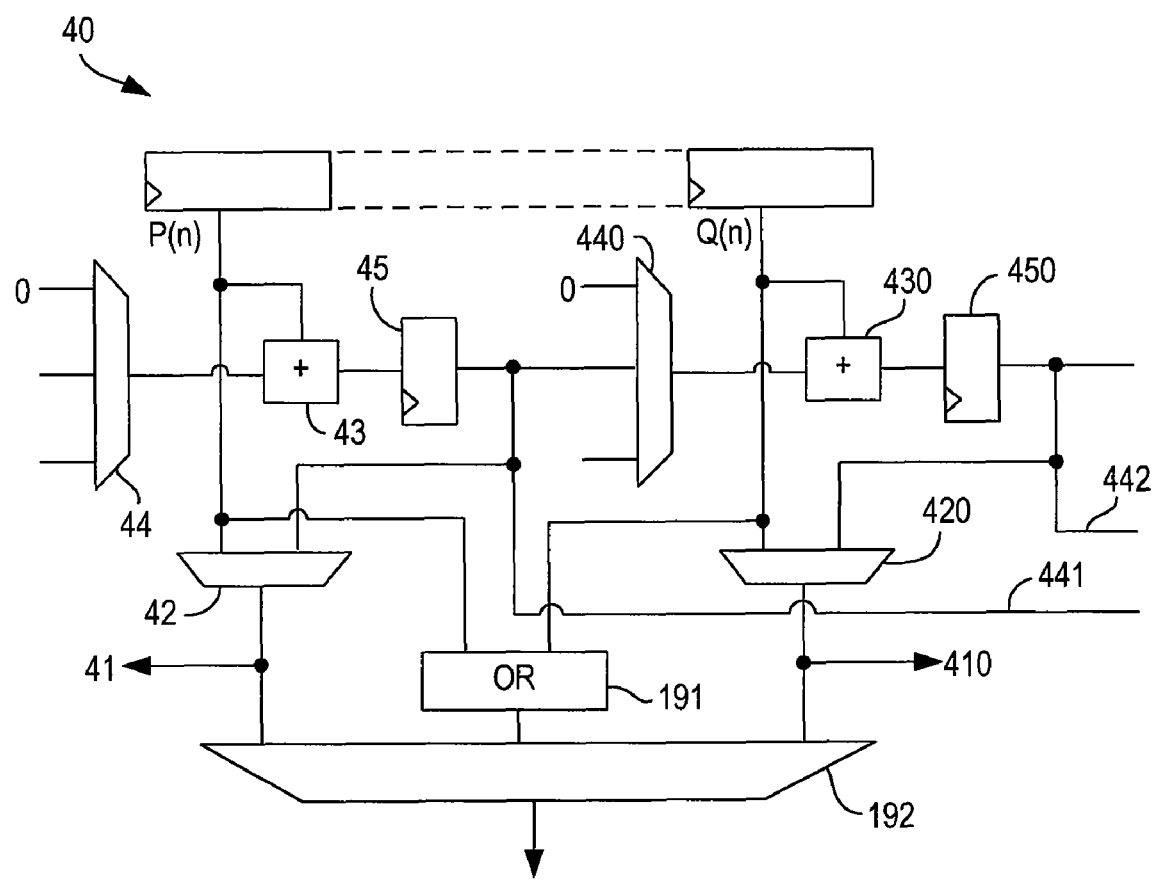
FIG. 4 is a block diagram of a preferred embodiment of an output stage of a specialized processing block in accordance with the present invention.

Outputs P(n), Q(n) can be used individually, or a plurality of blocks 10 (or half-blocks 20) can be chained together using the cascade stage 40 shown in FIG. 4. Using cascade stage 40, output P(n) can be output at 41 via multiplexer 42. Alternatively, output P(n) can be added at 43 to the output of three-input multiplexer 44, then registered at 45 and output at 41 via multiplexer 42 and/or chained to three-input multiplexer 440 or, via line 441, to the third input of three-input multiplexer 44 of the next half-block 20. Similarly, output Q(n) can be output at 410 via multiplexer 420. Alternatively, output Q(n) can be added at 430 to the output of three-input multiplexer 440, then registered at 450 and output at 410 via multiplexer 420 and/or chained to three-input multiplexer 44 of the next half-block 20 or, via line 442, to the third input of three-input multiplexer 440 of the next half-block 20.

Figure 5:
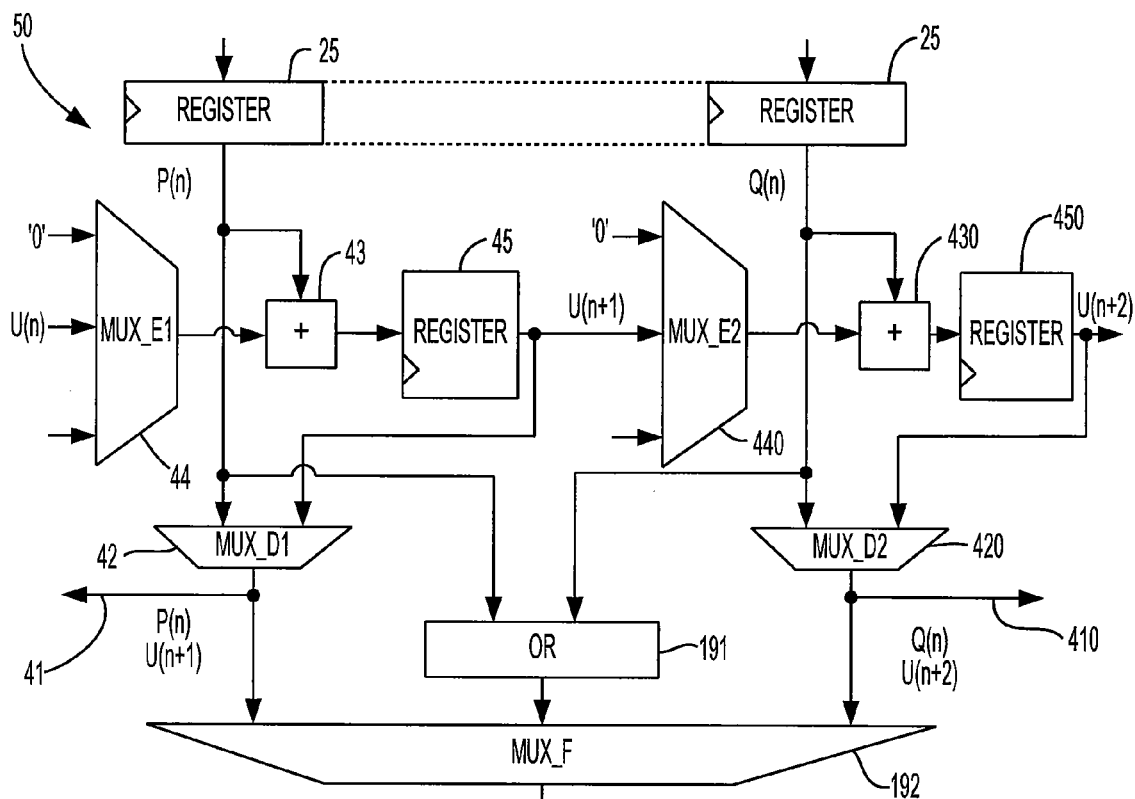
FIG. 5 is a diagram of the output stage of FIG. 4 configured in a first mode in accordance with the present invention.
Figure 6:
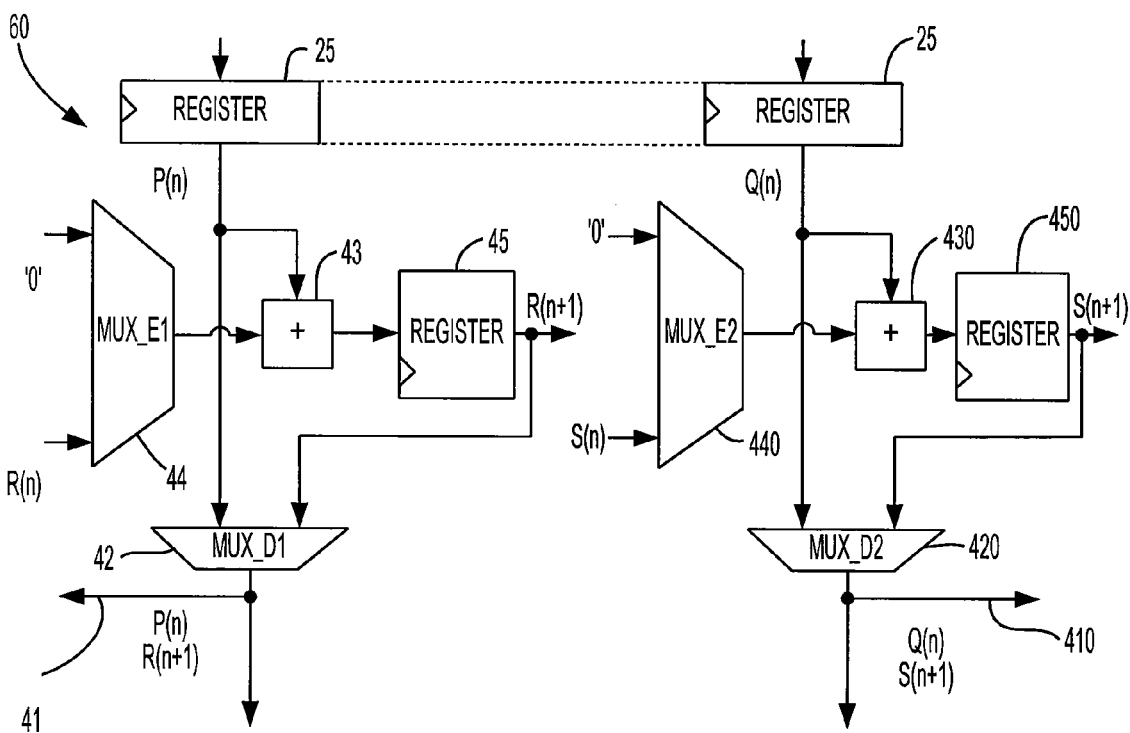
FIG. 6 is a diagram of the output stage of FIG. 4 configured in a second mode in accordance with the present invention.

FIG. 5 shows an embodiment 50 where the P(n) and Q(n) outputs are cascaded together. In this embodiment, each three-input multiplexer 44, 440 selects its second input and lines 441, 442 are unused. This mode can be used for vector multiplications whose outputs are real, including, but not limited to, systolic form FIR filter 1200, described below in connection with FIG. 12. FIG. 6 shows an interlaced cascade embodiment 60 where the P(n) and Q(n) outputs are cascaded separately. In this embodiment, each three-input multiplexer 44, 440 selects its third input, using lines 441, 442. This mode can be used for vector multiplications whose outputs are complex.

Specialized processing block 10 of the present invention may be programmably configured as a barrel shifter. Specifically, by using the 36-by-36 multiplier mode, a 32-bit vector can be arithmetically or logically shifted to the left or to the right. Such a shift by N bits may be accomplished by multiplying the vector to be shifted by a second vector of equal length, all of whose bits are 0 except for the Nth least significant bit, which is 1.

Figure 7:
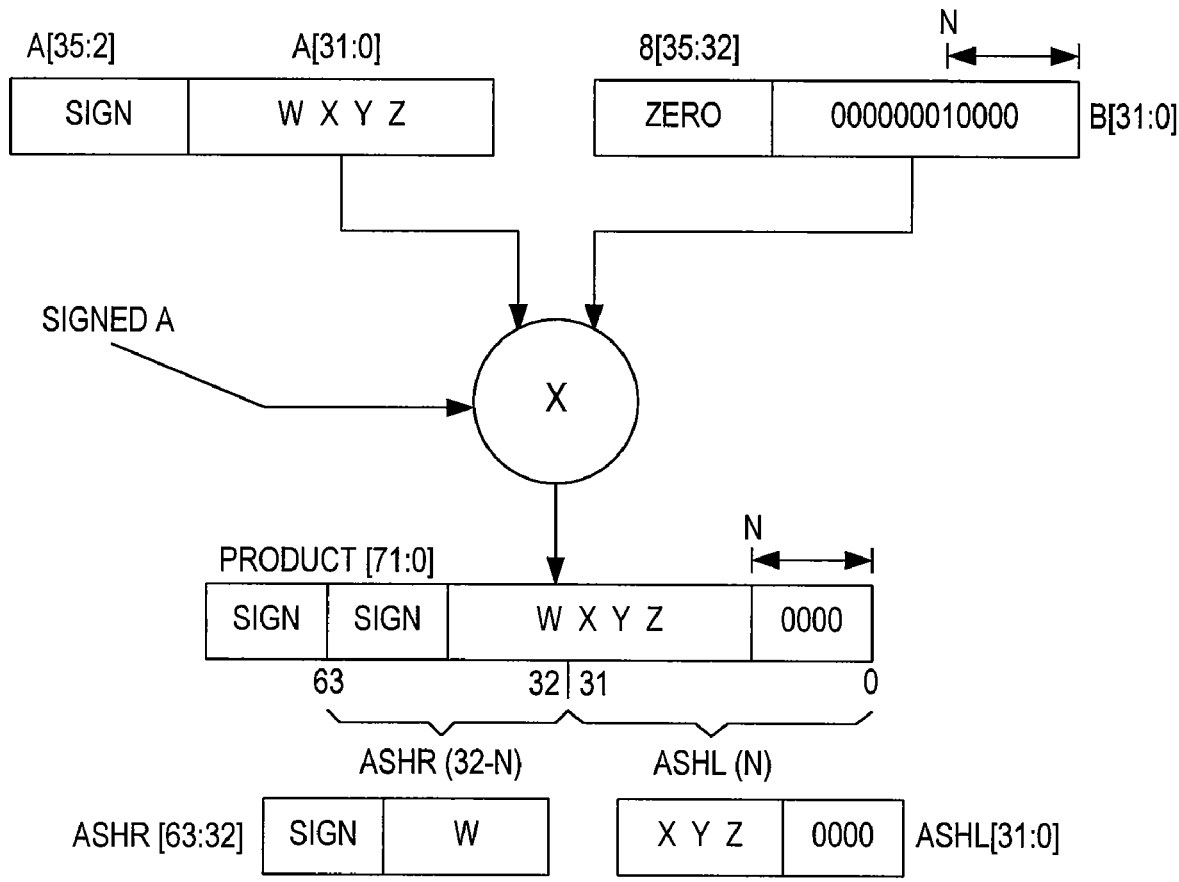
FIG. 7 is a functional diagram of a specialized processing block in accordance with the present invention configured for arithmetic shifting.

If the vector to be shifted is sign-extended to 36 bits and the second vector is padded with zeroes to 36 bits, the result is an arithmetic shift, and whether the shift is to the left or to the right depends on whether the result is taken, respectively, from the 32 most significant bits of the 64-bit result, or the 32 least significant bits. FIG. 7 shows such a shifting operation.

Figure 8:
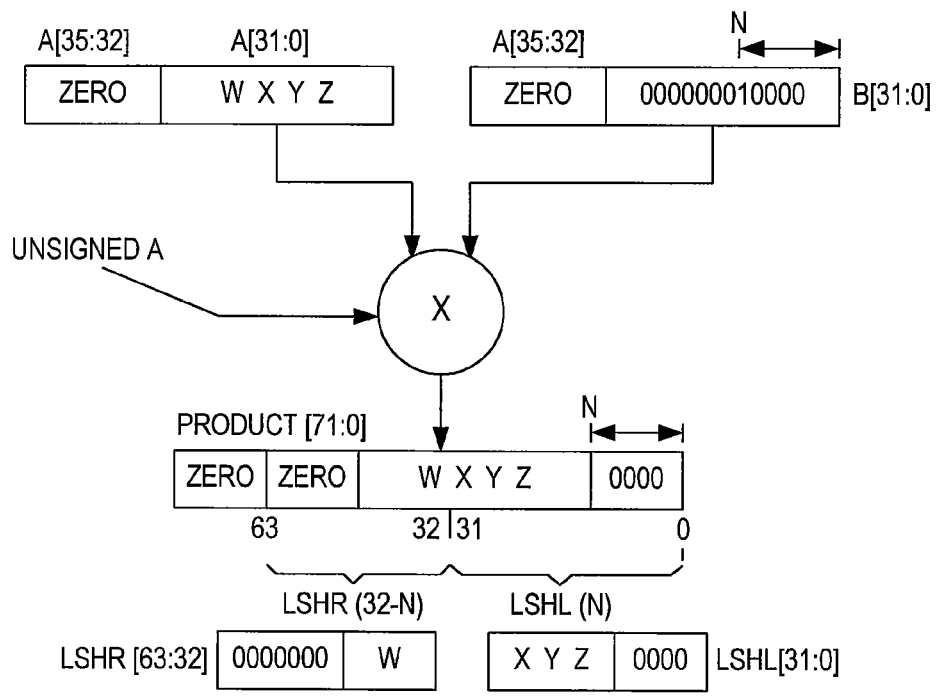
FIG. 8 is a preferred embodiment of an output stage of a specialized processing block in accordance with the present invention configured for logical shifting.

Similarly, if both vectors are padded with zeroes to 36 bits, the result is a logical shift, and whether the shift is to the left or to the right depends on whether the result is taken, respectively, from the 32 most significant bits of the 64-bit result, or the 32 least significant bits. FIG. 8 shows such a shifting operation.

Figure 9:
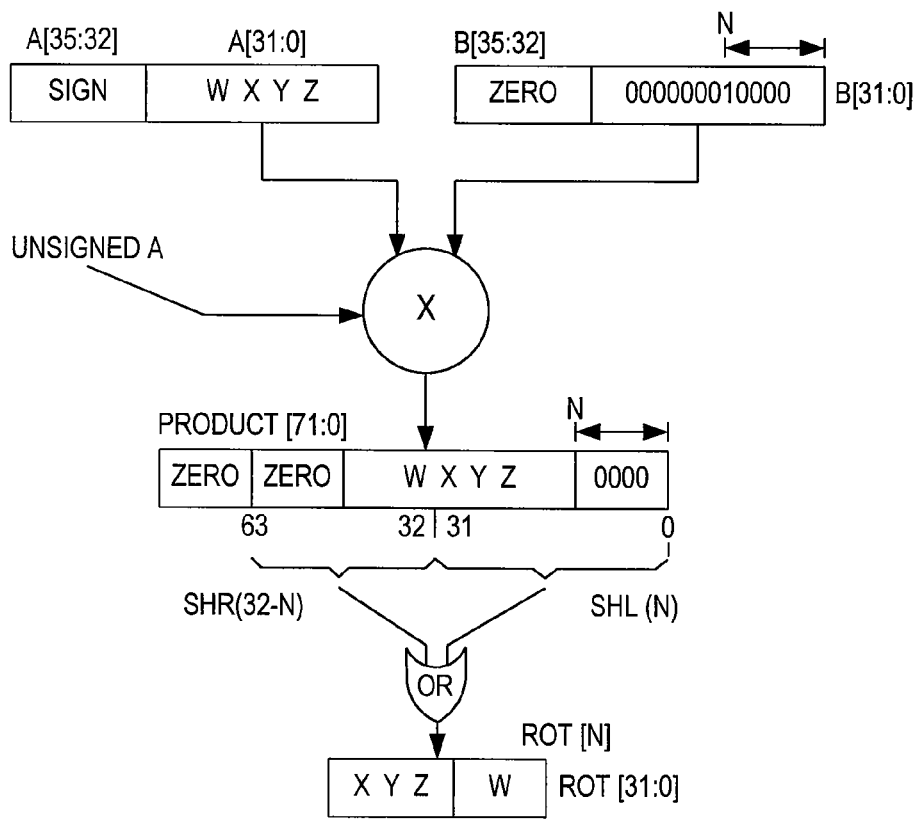
FIG. 9 is a functional diagram of a specialized processing block in accordance with the present invention configured for rotation.

In addition, if both vectors are padded with zeroes to 36 bits, and the 32 most significant bits of the 64-bit result are ORed with the 32 least significant bits, the result is a rotation of the N most significant bits of the first vector to the N least significant bits of the result, as shown in FIG. 9.

Figure 10:
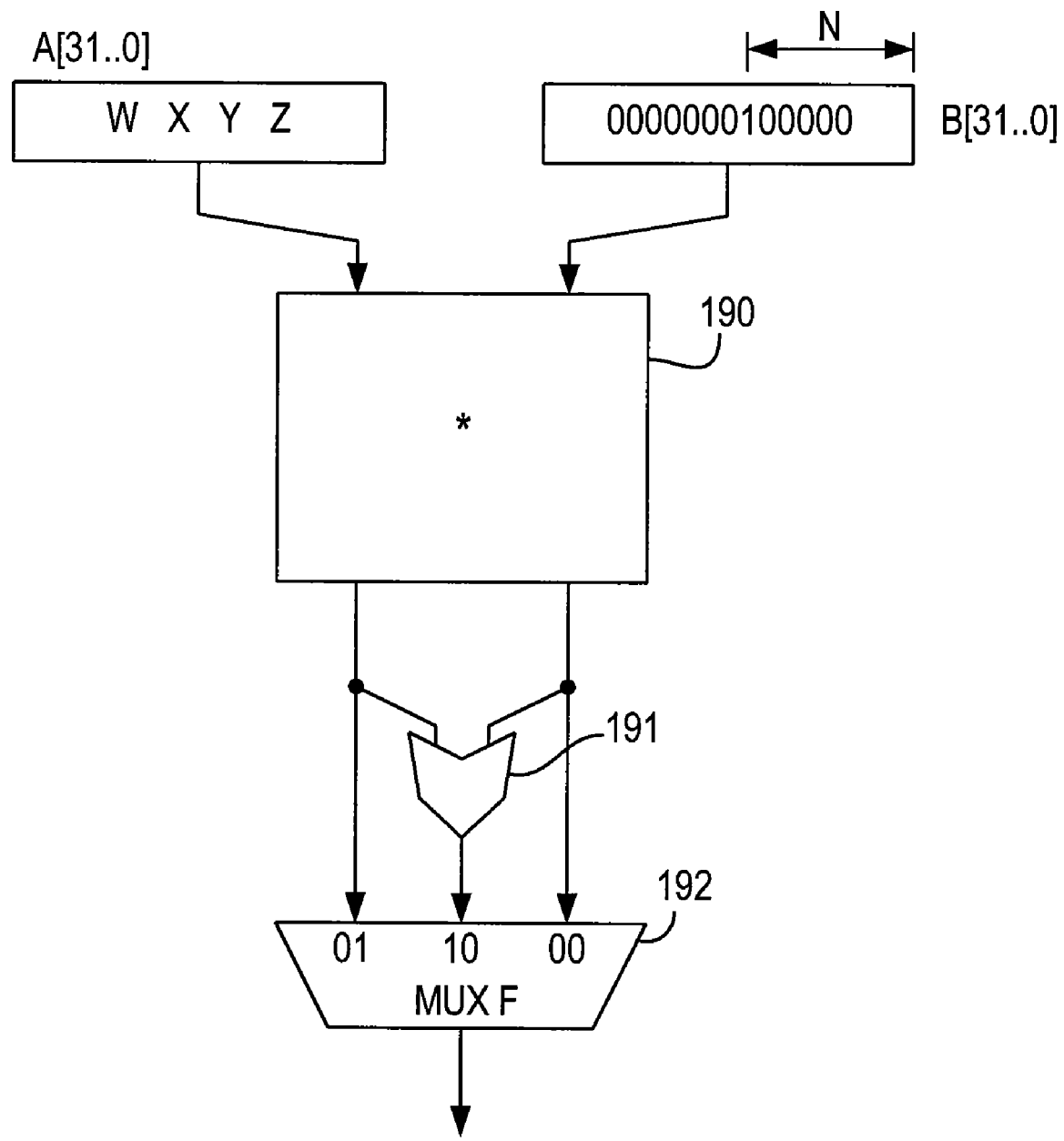
FIG. 10 is a functional diagram of a specialized processing block in accordance with the preferred invention configured as a barrel shifter.

FIG. 10 shows how the arithmetic and logical shifting, and rotation, can be performed using the 36-by-36 multiplier mode 190 to perform the 32-by-32 multiplication as described above, an OR gate 191 whose inputs are the two 32-bit halves of the 64-bit result, and a three-input multiplexer 192, operating according to the following table:

| A | B | MUX | Result |
|---|---|---|---|
| Signed | Unsigned | 00 | Arithmetic shift left |
| Signed | Unsigned | 01 | Arithmetic shift right |
| Unsigned | Unsigned | 00 | Logical shift left |
| Unsigned | Unsigned | 01 | Logical shift right |
| Unsigned | Unsigned | 10 | Rotation |

It should be noted that the arithmetic shift left and the logical shift left produce the same result and thus those cases are redundant. Put another way, a signed input is really needed only for the arithmetic shift right.

Figure 11:
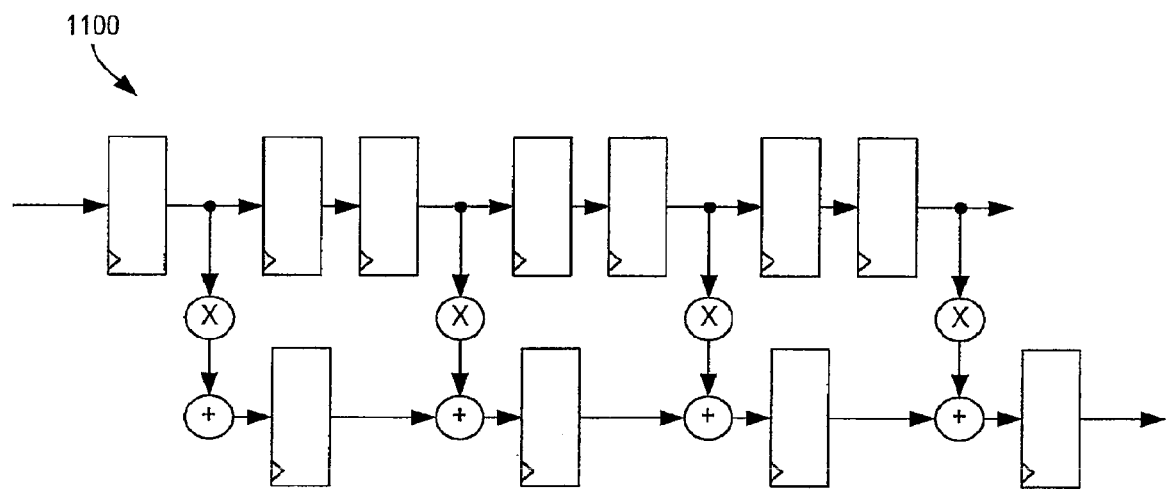
FIG. 11 is a representation of a conventional finite impulse response filter.
Figure 12:
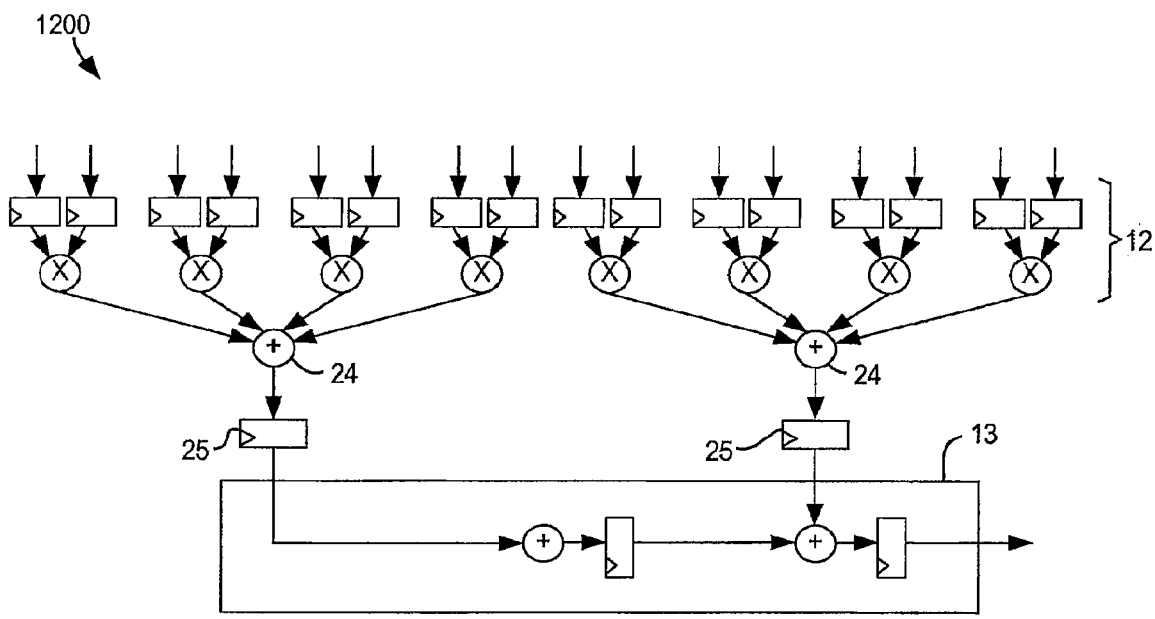
FIG. 12 is a functional diagram of a specialized processing block in accordance with the present invention configured as a finite impulse response filter.

Specialized processing block 10 of the present invention may be programmably configured as a finite impulse response (FIR) filter. FIG. 11 shows a conventional FIR filter 1100 of the systolic form, while FIG. 12 shows a systolic form FIR filter 1200 configured from specialized processing block 10. As seen in comparing FIGS. 11 and 12, the use of compressors in fundamental processing units 100 as opposed to additional adders reduces the latency in FIR filter 1200 as compared to FIR filter 1100.

Thus it is seen that a specialized processing block for a programmable logic device, based on a plurality of fundamental processing units, has been provided.

Figure 13:
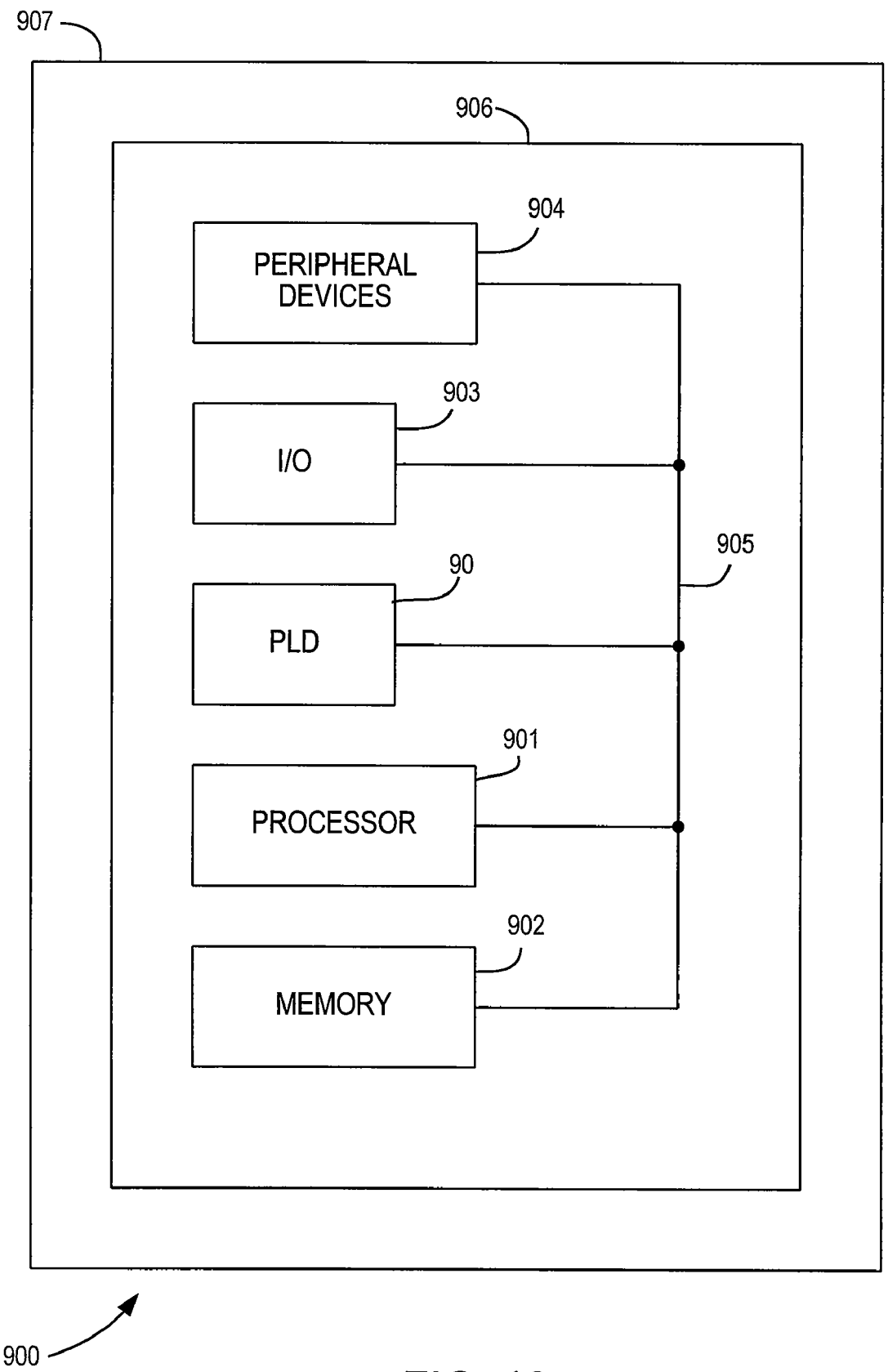
FIG. 13 is a simplified block diagram of an illustrative system employing a programmable logic device incorporating the present invention.

A PLD 90 incorporating such circuitry according to the present invention may be used in many kinds of electronic devices. One possible use is in a data processing system 900 shown in FIG. 13. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A specialized processing block for a programmable logic device, said specialized processing block comprising:
   a plurality of fundamental processing units, each of said fundamental processing units including:
   a plurality of multipliers, and
   circuitry for adding, in one operation, partial products produced by all of said plurality of multipliers; and
   circuitry interconnecting said fundamental processing units, said circuitry interconnecting said fundamental processing units comprising circuitry for selectably combining outputs of said plurality of multipliers of each of a plurality of said fundamental processing units for combined input to said circuitry for adding, whereby said circuitry for adding selectably adds, in said one operation, said partial products produced by all of said plurality of multipliers in each of said plurality of said fundamental processing units.

2. The specialized processing block of claim 1 wherein each of said fundamental processing units further comprises circuitry for shifting said partial products prior to adding them.

3. The specialized processing block of claim 1 further comprising loopback circuitry for feeding back an output of said specialized processing block to an input of said specialized processing block.

4. The specialized processing block of claim 3 wherein said loopback circuitry provides an accumulation function.

5. The specialized processing block of claim 3 wherein said loopback circuitry is used to configure said specialized processing block as an adaptive filter.

6. The specialized processing block of claim 3 further comprising input multiplexing circuitry for distributing inputs from a plurality of sources.

7. The specialized processing block of claim 6 wherein said plurality of sources comprises an input to said specialized processing block and an output of said specialized processing block.

8. The specialized processing block of claim 7 wherein said plurality of sources further comprises an input of another said specialized processing block.

9. The specialized processing block of claim 6 wherein said input multiplexing circuitry comprises registers for registering said inputs.

10. The specialized processing block of claim 9 wherein said registers are chained for inputting data seriatim to each said plurality of multipliers.

11. The specialized processing block of claim 1 further comprising an output stage, said output stage including:
    for each of at least one fundamental processing unit of said specialized processing block:
    a cascade multiplexer for selecting a previous cascade output,
    an output cascade adder for adding an output of said at least one fundamental processing unit to said previous cascade output,
    an output multiplexer for selecting between said output of said at least one fundamental processing unit and an output of said output cascade adder, and
    first and second conductors for conducting said output of said output cascade adder to respective cascade multiplexers associated with subsequent fundamental processing units.

12. The specialized processing block of claim 11 wherein:
    said first conductor conducts said output of said output cascade adder to an immediately subsequent fundamental processing unit;
    said second conductor conducts said output of said output cascade adder to a cascade multiplexer associated with a fundamental processing unit immediately subsequent to said immediately subsequent fundamental processing unit; and
    each said cascade multiplexer selects among (1) zero, (2) output of an immediately previous output cascade adder, and (3) output of an output cascade adder immediately previous to said immediately previous output cascade adder.

13. A programmable logic device comprising the specialized processing block of claim 1.

14. A digital processing system comprising:
    processing circuitry;
    a memory coupled to said processing circuitry; and
    a programmable logic device as defined in claim 13 coupled to the processing circuitry and the memory.

15. A printed circuit board on which is mounted a programmable logic device as defined in claim 13.

16. The printed circuit board defined in claim 15 further comprising:
    memory circuitry mounted on the printed circuit board and coupled to the programmable logic device.

17. The printed circuit board defined in claim 16 further comprising:
    processing circuitry mounted on the printed circuit board and coupled to the memory circuitry.

18. An integrated circuit device comprising the specialized processing block of claim 1.

19. A digital processing system comprising:
    processing circuitry;
    a memory coupled to said processing circuitry; and
    an integrated circuit device as defined in claim 18 coupled to the processing circuitry and the memory.

20. A printed circuit board on which is mounted an integrated circuit device as defined in claim 18.

21. The printed circuit board defined in claim 20 further comprising:
    memory circuitry mounted on the printed circuit board and coupled to the programmable logic device.

22. The printed circuit board defined in claim 21 further comprising:
    processing circuitry mounted on the printed circuit board and coupled to the memory circuitry.

23. The specialized processing block of claim 1 wherein said circuitry for selectably combining comprises:
    a compressor in one of said fundamental processing units; and
    a multiplexer in a respective other one of said fundamental processing units for selectably inputting said partial products produced by said plurality of multipliers in said respective other one of said fundamental processing units into said compressor in said one of said fundamental processing units.

* * * * *